United States Patent [19]
Chang et al.

[11] Patent Number: 6,075,986
[45] Date of Patent: Jun. 13, 2000

[54] IN-SET EVALUATION PROCEDURES FOR COMPONENTS

[75] Inventors: David Der Chi Chang; John Francis D'Amico, both of Princeton, N.J.

[73] Assignee: Lucent Technologies Inc., Murray Hill, N.J.

[21] Appl. No.: 08/944,319

[22] Filed: Oct. 6, 1997

[51] Int. Cl.[7] .................................................. H04Q 7/20
[52] U.S. Cl. .......................................... 455/423; 455/67.4
[58] Field of Search ................................... 455/67.1, 674, 455/226.1, 423; 324/625

[56] References Cited

U.S. PATENT DOCUMENTS

| | | | |
|---|---|---|---|
| 4,161,064 | 7/1979 | Woodman, Jr. et al. | 29/741 |
| 4,679,248 | 7/1987 | McKeown | 455/226 |
| 5,734,270 | 3/1998 | Buchanan | 324/754 |
| 5,742,589 | 4/1998 | Murata | 370/249 |
| 5,875,397 | 2/1999 | Sasin et al. | 455/423 |

*Primary Examiner*—Nguyen Vo
*Assistant Examiner*—Naghmeh Mehrpour

[57] ABSTRACT

A method for in-set evaluation of critical characteristics and parameters of components utilized in various devices. A component in a device to be evaluated is installed in the actual complex device using a socket for easy placement and removal of multiple components. Additional modifications are made to the device to permit logical evaluation of the critical component parameters of the component in the device. In an exemplary embodiment, evaluation of duplexers utilized in cordless and cellular telephones requires the placement of a desense switch to permit taking measurements in isolation and measurements affected by transmitter interference.

24 Claims, 5 Drawing Sheets

FIG. 3A
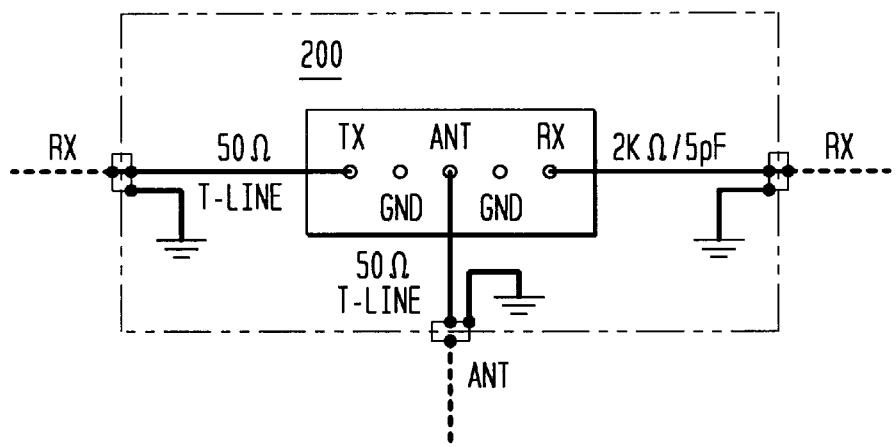
FIG. 3B
| PATH | CONNECT: TX TO | ANT TO | RX TO |
|---|---|---|---|
| TX-ANT | PORT 1 | PORT 2 | OPEN |
| ANT-RX | 50Ω TERM. | PORT 1 | PORT 2 |
| TX-RX | PORT 1 | 50Ω TERM. | PORT 2 |
| TX(VSWR) | PORT 1 | 50Ω TERM. | PORT 2 |
FIG. 3C
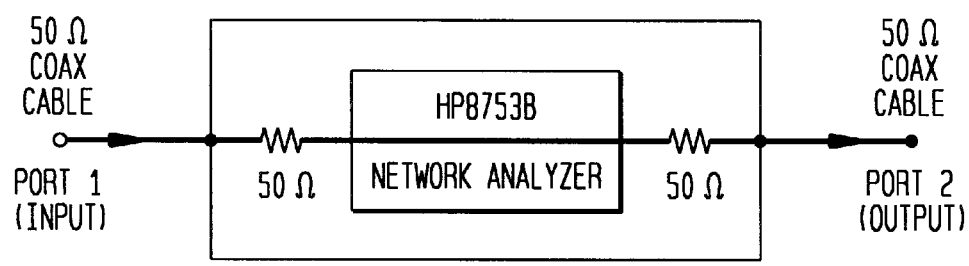

IN-SET EVALUATION PROCEDURES FOR COMPONENTS

FIELD OF THE INVENTION

This invention relates to the evaluation of components to be assembled and operated in a complex electronic device, e.g., a telephone set performance and in particular, to in-set performance evaluations of the components.

BACKGROUND OF THE INVENTION

In general, many industries specify component requirements which are then made available to various potential manufacturers. For example, in the telecommunications industry, cordless telephones require duplexers with certain characteristics and design tolerances. The manufacturers then attempt to design and manufacture the component, e.g. the duplexer, with the required specifications at the lowest cost. Every manufacturers' components vary in design, acceptable tolerances and cost. Moreover, components obtained from the manufacturer also vary in performance from component to component. However, each of the manufacturers' components must perform in accordance with the stated characteristics or specifications. As a consequence, designers must evaluate the characteristics of a sample set of components from each manufacturer to determine in terms of performance and cost, which manufacturer to select.

For most high frequency components manufacturers supply the designers with test fixtures so as to permit proper component testing. That is, the designers can test each of the components in an isolated fashion to measure some performance characteristics. For example, multiple attenuation levels are measured between the transmitter, antenna and receiver paths when evaluating duplexers required in cordless telephones. However, since the measurement is done in isolation, certain critical parameters may not correctly evaluate the performance in the actual complex device for which it is designed. For example, the prior art testing does not account for the affect of signal interference due to normal operating conditions. That is, the performance of the duplexer or any other component requires signal measurements while in a fully operational configuration. Accordingly, there is a need to provide a simple and effective apparatus and method which evaluates and characterizes the in-set performance of a component in the specified device.

SUMMARY OF THE INVENTION

The present invention teaches a method and an apparatus which permits in-set evaluation of critical characteristics and parameters of components utilized in various devices. This method permits designers to evaluate components supplied from different manufacturers in the same environment. Importantly, the method enables total characterization of the component and the device.

In an exemplary embodiment of the present method, a component to be evaluated is installed in the actual complex device using a socket for easy placement and removal of multiple components. Additional modifications are then made to the device to permit a logical evaluation of the critical component parameters of the component in the device. For example, when evaluating duplexers utilized in cordless telephones, a desense switch is installed that permits taking both measurements in isolation and measurements affected by transmitter interference. In cordless and cellular telephones which have processors, the switch is implementable via software. The device is then connected to various analyzers to measure the critical parameters.

Advantageously, the method and apparatus of the present invention can be utilized with any device which employs various components in its design. The above factors make the present invention a versatile and efficient method for evaluating the performance of components utilized in devices.

BRIEF DESCRIPTION OF THE DRAWINGS

A more complete understanding of the present invention may be obtained from consideration of the following description in conjunction with the drawings in which:

FIG. 3(a), 3(b) and 3(c) illustrate connection schemes in accordance with the present invention;

DETAILED DESCRIPTION

In general, the present invention provides a method for fully characterizing the performance of a component or multiple components in a given device. That is, the method permits measurements of those parameters that can be taken only when the component is operationally intact in a fully functional device. The method evaluates the components on a first level by taking measurements in isolation utilizing test equipment as needed, including a fixture for high frequency work. The second level of characterization requires measuring the components in the device to examine the affect of a fully functioning device on the overall performance of the device and in turn, the component. In this way, the method permits evaluation of all of the critical characteristics and parameters of the components utilized in various devices. Components supplied from different manufacturers can then be measured in the same environment to assess component tolerance and performance characteristics. The objective is to relate the isolated component test requirements to reflect adequate performance in the complex device.

In an exemplary embodiment of the present method, a cordless telephone is evaluated in accordance with the present invention. Specifically, duplexers utilized in the base and in the handset are evaluated. Although the method is presented with respect to the evaluation of duplexers in cordless telephones, the present invention method is applicable to other components. For example, certain parameters for the liquid crystal display can be measured only when the device is operational, such as the image contrast and the turn on/off times. As such, the method and apparatus of the present invention can be utilized with any device which employs various components in its design.

Figure 1:
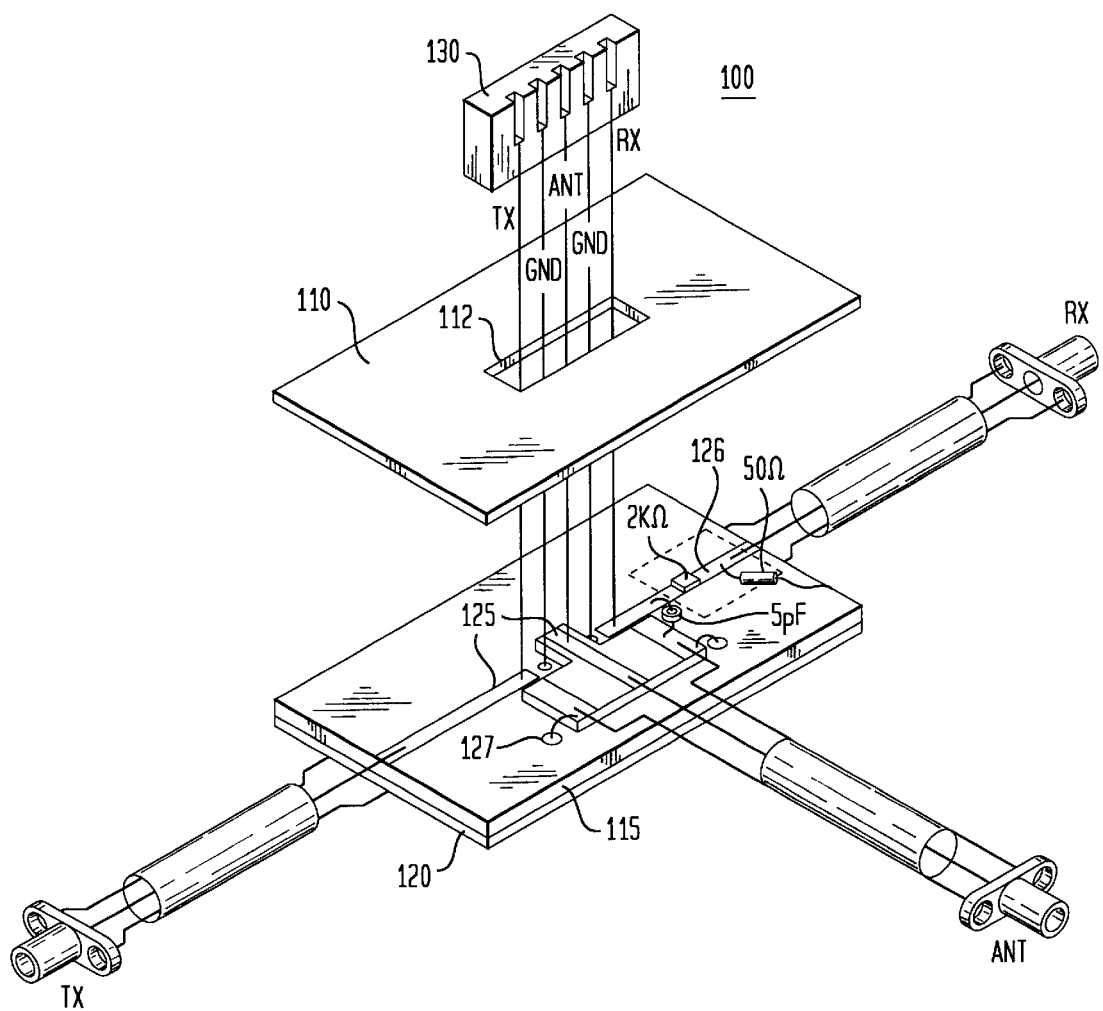
FIG. 1 is a perspective view of an exemplary embodiment of a test fixture in accordance with the present invention.
Figure 2:
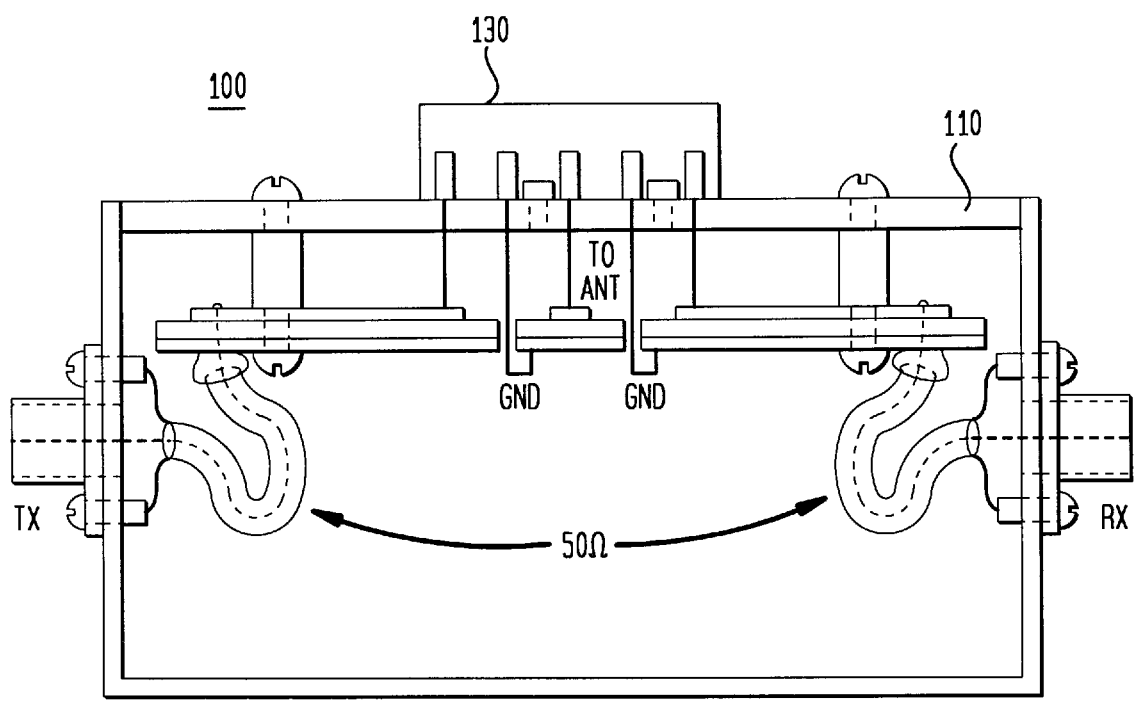
FIG. 2 is a side view of the exemplary embodiment shown in FIG. 1.

FIG. 1 and FIG. 2 depict an exemplary embodiment of test fixture 100 which is used for first level characterization of the duplexer. The construction of test fixture 100 has a significant effect on the duplexer frequency performance. Test fixture 100 includes a box cover 110, a dielectric plate 115, a ground plate 120 and a socket 130. Box cover 110 is a dielectric plate and has an opening 112 to facilitate soldering of socket lines TX, GND, ANT, GND and RX of socket 130 to transmission lines 125 and 126. The above socket lines are connected to flange-mounted SMA cable jacks by transmission lines 125 and 126. Transmission line 125, for example, is a 32 MIL FR4 50 ohm impedance transmission line. The proper impedance for the transmit (TX) and antenna (ANT) ports is 50 Ω and for the receiver port (RX) it is 2 kΩ/5 pF. An SMA terminated 50 Ω load is connected as needed to the respective cable jack fittings.

FIG. 3(a) is a schematic 200 for test fixture 100 and along with FIG. 3(b) and FIG. 3(c), illustrates how network analyzers are to be connected to obtain the proper first level measurements, e.g., the attenuation values for the TX-ANT path, ANT-RX path, TX-RX path and the voltage standing wave ratio or forward transmission coefficient. The measurements are made for each frequency range and for a multiple number of duplexers. The measurements are then plotted to compare the performance of the different duplexers.

Figure 4:
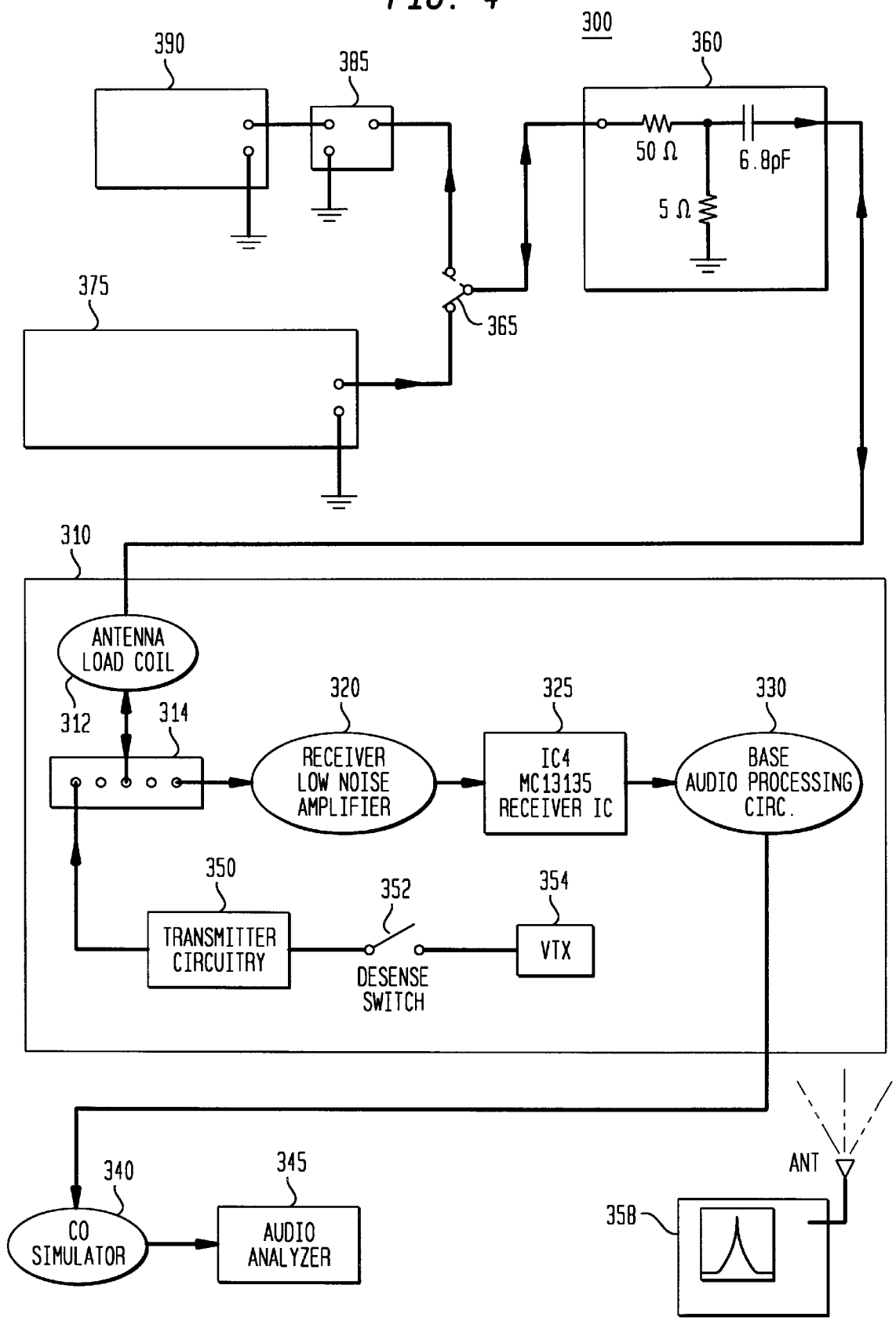
FIG. 4 is an exemplary embodiment of an in-set test connection for a duplexer in a base portion of a cordless telephone in accordance with the present invention.
Figure 5:
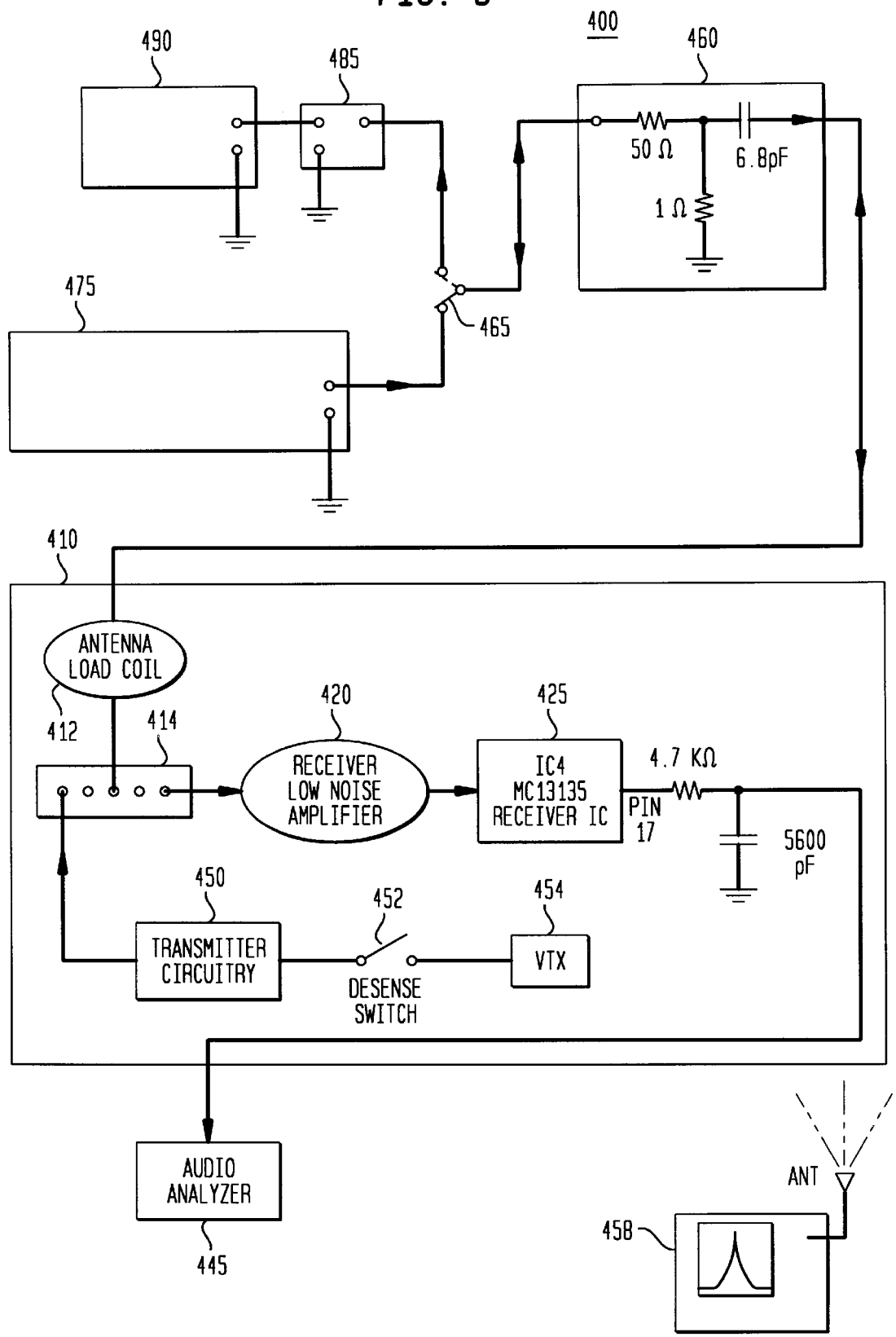
FIG. 5 is an exemplary embodiment of an in-set test connection for a duplexer in a handset portion of a cordless telephone in accordance with the present invention.

Second level characterization is then achieved by removing the duplexer from both the handset and base pieces of the cordless phone and replacing it with a socket type device which permits easy placement and removal of the duplexers. The second level characteristics or critical parameters that are then measured are the received Signal-to-Noise and Distortion values ("SINAD"), desense, and transmit power. FIG. 4 and FIG. 5 illustrate the test configurations used for both the handset and the base.

Referring to FIG. 4, a test configuration 300 is illustrated for testing the duplexer in the base set. A base set 310 includes an antenna load coil 312, which is connected to one lead of a duplexer socket 314. As mentioned above, duplexer socket 314 is placed where the component being tested was situated. Antenna load coil 312 is connected to a base antenna simulator 360, which is then connected through a switch 365 either to a RF generator 375 or a power sensor 385. Power sensor 385 is further connected to a power meter 390. A second lead of duplexer socket 314 is connected to a receiver low noise amplifier 320, a receiver processor 325 and a base audio processing circuit 330. The latter three units all being a part of base unit 310. Base audio processing circuit 330 is connected to a CO simulator 340 and a audio analyzer 345. A third lead of duplexer socket 314 is connected to a transmitter circuitry 350 and a base transmitter bias 354. A desense switch 352 is inserted between transmitter circuitry 350 and base transmitter bias 354 to permit taking all of the required measurements. In cellular or cordless telephones having smart technology, software can be used as a switch. A spectrum analyzer 358 monitors the selected channel frequencies.

Duplexer evaluation is then performed by placing a duplexer in duplexer socket 314 and selecting appropriate base channel frequencies using the handset channel selection switch. A handset signal from RF generator 375 to the companion base channel was injected at base antenna simulator 360. Once the frequency channel pair is set, the handset transmitter can be turned off without affecting the base transmitter. The power level, measured in dBm, of injected handset carrier at RF generator 375 is then varied and the corresponding base receiver SINAD levels are measured on audio analyzer 345. At SINAD=12, base desense was measured by turning on the base transmitter bias 354, VTX. The change in SINAD, Δ(dB) termed desense, is recorded. Base transmitter bias 354 is disconnected and the measurement cycle continued. Base transmitted power delivered through the duplexer through base antenna simulator 360 is measured using power meter 390. The above is repeated for various duplexers and frequencies.

Referring now to FIG. 5, a test configuration 400 is illustrated for testing the duplexer in the handset. A handset 410 includes an antenna load coil 412, which is connected to one lead of a duplexer socket 414. As mentioned above, duplexer socket 414 is placed where the component being tested was situated. Antenna load coil 412 is connected to a handset antenna simulator 460, which is then connected through a switch 465 either to a RF generator 475 or a power sensor 485. Power sensor 485 is further connected to a power meter 490. A second lead of duplexer socket 414 is connected to a receiver low noise amplifier 420, a receiver processor 425 and a band select low pass filter 430. The latter three units all being a part of handset unit 410. Band select low pass filter 430 is connected to a audio analyzer 445. A third lead of duplexer socket 414 is connected to a transmitter circuitry 450 and a handset transmitter bias 454. A desense switch 452 is inserted between transmitter circuitry 450 and handset transmitter bias 454. As stated above, cordless telephones having smart technology can utilize software as a switch. A spectrum analyzer 458 monitors the selected channel frequencies.

Duplexer evaluation in the handset is performed by placing a duplexer in duplexer socket 414 and selecting appropriate handset channel frequencies using the handset channel selection switch. This process requires that the base transmitter to be on briefly to enable the handset transmitter. The base transmitter is then turned off to prevent transmission interference with the injected RF handset carrier signal. As stated above, once the channel pair is set, the power level of the injected base carrier is varied and the corresponding SINAD levels measured on audio analyzer 445. Again, at SINAD=12, the handset desense is measured by disconnecting VTX 454 and halting the handset transmitter. After the desense value is measured, then VTX 454 is reconnected. The handset transmitted power delivered through the duplexer is determined by power meter 490 through antenna simulator 460. Once the above measurements are taken for a variety of duplexers, the measurements are plotted and comparisons can be made to determine which duplexers have the best performance.

Third level characterization is performed by doing walk range tests. These tests measure the effect of duplexer characteristics on telephone set performance. These walk range tests are performed by placing different combinations of duplexers in the base and handset units. That is, a duplexer manufactured by manufacturer one is placed in the handset and a duplexer manufactured by manufacturer two is placed in the base. The walk range test is then performed. This is then repeated for another combination of manufacturer duplexers. The tests measure the range at which talk/listen capabilities are acceptable and at the various operational frequencies. The ranges for the various combinations can be placed in a table or plot to determine which duplexers are acceptable.

The above levels of testing provide a total characterization of the duplexers in the cordless telephones. The combination of isolation testing, in-set testing and actual performance provide three levels of testing which can be compared against each other to verify and complement the performance measurements. This methodology is easily extendable to more than one component at a time and to other types of devices.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed:

1. A method for evaluating the total performance of at least one component used in a device, said method comprising the steps of:
   replacing the at least one component with a socket means which permits placement and removal of the at least one component, wherein said socket means permits in-set evaluation of the at least one component;
   placing one component of a plurality of components in said socket means;
   measuring a set of critical performance parameters for said one component when the device is fully functional and operational wherein said step of measuring includes the step of
      setting a channel frequency pair for evaluating the performance of said one component;
      varying a power level provided to said one component; and
      measuring a corresponding performance parameter of said one component;
   repeating said steps of placing and measuring for another of said plurality of components; and
   comparing said set of critical performance parameters to determine which of said plurality of components meets a set of required specifications.

2. The method according to claim 1, including the steps of:
   placing said plurality of components one at a time in a test fixture for testing said plurality of components in isolation;
   measuring a set of parameters of said plurality of components while not being affected by the operational characteristics of the device; and
   correlating said set of parameters measured in isolation with results obtained from in-set evaluation.

3. The method according to claim 1, wherein said method includes the step of placing a desense switch in the device when the device is one of a base unit and a handset unit of a cordless phone and the at least one component is a duplexer.

4. The method according to claim 3, wherein said step of measuring further includes the steps of:
   varying the power level of an injected carrier signal;
   measuring a corresponding receiver SINAD level; and
   determining a desense value when said SINAD level equals 12.

5. The method according to claim 4, including the steps of:
   placing a first duplexer in said handset unit;
   placing a second duplexer in said base unit; and
   measuring a walk range of said handset unit and said base unit.

6. The method according to claim 5, wherein said first duplexer and said second duplexer are from a same manufacturer.

7. The method according to claim 5, wherein said first duplexer and said second duplexer are from different manufacturers.

8. A method for total characterization of components used in devices, said method comprising the steps of:
   determining a first level characterization of said components by evaluating said components in isolation from the devices; and
   determining a second level characterization of said components by evaluating said components in an in-set manner, wherein said step of determining a second level characterization includes measuring a set of critical performance parameters for said one component influenced by fully operational devices wherein said step of measuring includes the steps of
      setting a channel frequency pair for evaluating the performance of said one component;
      varying the power level provided to said one component; and
      measuring a corresponding performance parameter of said one component.

9. The method according to claim 8, wherein said step of determining further includes the steps of:
   replacing the components with a corresponding socket means for substantially easy placement and removal of the components, wherein said corresponding socket means permits in-set evaluation of the components;
   placing one component of a plurality of components in said corresponding socket means;
   repeating said steps of placing and measuring for another of said plurality of components; and
   comparing said set of critical performance parameters to determine which of said plurality of components meets a set of required specifications.

10. The method according to claim 9, wherein said method includes the step of placing a desense switch in the devices when the devices are one of a base unit and a handset unit of a cordless phone and the components are duplexers.

11. The method according to claim 10, wherein said step of measuring further includes the steps of:
   varying the power level of an injected carrier signal;
   measuring a corresponding receiver SINAD level; and
   determining a desense value when said SINAD level equals 12.

12. The method according to claim 11, including the steps of:
   placing a first duplexer in said handset unit;
   placing a second duplexer in said base unit; and
   measuring a walk range of said handset unit and said base unit.

13. The method according to claim 12, wherein said first duplexer and said second duplexer are from a same manufacturer.

14. The method according to claim 12, wherein said first duplexer and said second duplexer are from different manufacturers.

15. A method for evaluating the performance of duplexers in cordless phones, said cordless phones including a base unit and a handset unit, said method comprising the steps of:
   determining a first level characterization of said duplexers by evaluating said duplexers in isolation from the cordless phones; and
   determining a second level characterization of said duplexers by evaluating said duplexers in an in-set manner, wherein said step of determining a second level characterization includes measuring a set of critical performance parameters for said duplexers influenced by fully operational cordless phones, wherein said step of measuring includes the steps of
      setting a channel frequency pair for evaluating the performance of said duplexers;
      varying the power level provided to said duplexers; and
      measuring a corresponding performance parameter of said duplexers.

16. The method according to claim 15, wherein said step of determining further includes the steps of:

replacing the duplexers with a corresponding socket means for substantially easy placement and removal of the duplexers, wherein said corresponding socket means permits in-set evaluation of the duplexers;

placing one duplexer of a plurality of duplexers in said corresponding socket means;

repeating said steps of placing and measuring for another of said plurality of duplexers; and comparing said set of critical performance parameters to determine which of said plurality of duplexers meets a set of required specifications.

17. The method according to claim 16, wherein said step of measuring further includes the steps of:

varying the power level of an injected carrier signal;

measuring a corresponding receiver SINAD level; and determining a desense value when said SINAD level equals 12.

18. The method according to claim 17, including the steps of:

placing a first duplexer in said handset unit;

placing a second duplexer in said base unit; and measuring a walk range of said handset unit and said base unit.

19. The method according to claim 18, wherein said first duplexer and said second duplexer are from a same manufacturer.

20. The method according to claim 15, further including the step of correlating said first level characterization of said duplexers with said second level characterization of said duplexers.

21. A method for evaluating the total performance of a duplexer used in a device when the device is one of a base unit and a handset unit of a cordless phone, said method comprising the steps of:

replacing the duplexer with a socket means which permits placement and removal of the duplexer, wherein said socket means permits in-set evaluation of the duplexer;

placing a desense switch in the device;

placing one duplexer of a plurality of duplexers in said socket means;

measuring a set of critical performance parameters for said one duplexer when the device is fully functional and operational, wherein said step of measuring includes the steps of setting a channel frequency pair for evaluating the performance of the duplexer;

varying the power level of an injected carrier signal;

measuring a corresponding receiver SINAD level; and determining a desense value;

repeating said steps of placing and measuring for another of said plurality of duplexers; and comparing said set of critical performance parameters to determine which of said plurality of duplexers meets a set of required specifications.

22. The method according to claim 21, including the steps of:

placing a first duplexer in said handset unit;

placing a second duplexer in said base unit; and measuring a walk range of said handset unit and said base unit.

23. The method according to claim 22, wherein said first duplexer and said second duplexer are from a same manufacturer.

24. The method according to claim 22, wherein said first duplexer and said second duplexer are from different manufacturers.

* * * * *